United States Patent
Lin

(10) Patent No.: US 10,069,254 B1
(45) Date of Patent: Sep. 4, 2018

(54) RETRACTABLE CONNECTING DEVICE

(71) Applicants: INVENTEC (PUDONG) TECHNOLOGY CORPORATION, Shanghai (CN); INVENTEC CORPORATION, Taipei (TW)

(72) Inventor: Yu-Huan Lin, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/867,482

(22) Filed: Jan. 10, 2018

(30) Foreign Application Priority Data

Apr. 26, 2017 (CN) .......................... 2017 1 0282632

(51) Int. Cl.
*H01R 13/72* (2006.01)

(52) U.S. Cl.
CPC ......... *H01R 13/72* (2013.01); *H01R 2201/06* (2013.01)

(58) Field of Classification Search
CPC ............................ H01R 2201/06; H01R 13/72
See application file for complete search history.

(56) References Cited

U.S. PATENT DOCUMENTS

| | | | | |
|---|---|---|---|---|
| 5,207,727 | A * | 5/1993 | Pearce | B65B 5/068 206/443 |
| 2013/0277508 | A1* | 10/2013 | Trevithick | E21B 15/00 248/49 |
| 2015/0181747 | A1* | 6/2015 | Bailey | H05K 7/20736 361/679.48 |
| 2016/0081219 | A1* | 3/2016 | Jau | H05K 7/1487 361/679.02 |
| 2016/0209885 | A1* | 7/2016 | Ellis | H01R 31/065 |

* cited by examiner

*Primary Examiner* — Briggitte R Hammond
(74) *Attorney, Agent, or Firm* — Maschoff Brennan

(57) ABSTRACT

A retractable connecting device is adapted to connect a casing and a tray, wherein the tray is slidably disposed on the casing. The retractable connecting device includes a retractable guiding rod and an electrical connecting wire set. Two opposite ends of the retractable guiding rod are respectively fixed to the casing and the tray. The electrical connecting wire set includes a flexible wire and an adhesive structure. The two opposite ends of the flexible wire are respectively fixed to the casing and the tray. The adhesive structure is connected to the flexible wire. The adhesive structure has a through hole. The retractable guiding rod is disposed through the first through hole in order to guide the flexible wire to be folded or unfolded along the extending direction of the retractable guiding rod when the tray is moved with respect to the casing.

8 Claims, 8 Drawing Sheets

RETRACTABLE CONNECTING DEVICE

CROSS-REFERENCE TO RELATED APPLICATIONS

This non-provisional application claims priority under 35 U.S.C. § 119(a) on Patent Application No(s). 201710282632.5 filed in China on Apr. 26, 2017, the entire contents of which are hereby incorporated by reference.

BACKGROUND OF THE INVENTION

Technical Field of the Invention

The disclosure relates to a connecting device, more particularly to a retractable connecting device.

Description of the Related Art

Nowadays, the cloud computing and its applications are everywhere in our daily lives, and the amount of data is increasing with the boom of the service and internet devices, so server plays an important role in the cloud industry. To provide a better service, the operators purchase servers aggressively in order to enhance the information density in the data center.

To improve the efficiency of server maintenance and replacement procedure, some modules in a server are capable of being drawn out. Furthermore, the length of the cable should be long enough to keep the electrical connection between the server and the module while moving the module.

SUMMARY

One embodiment of the disclosure provides a retractable connecting device comprising a retractable guiding rod and an electrical connecting wire set, wherein the tray is slidably disposed on the casing. The retractable connecting device comprises a retractable guiding rod and an electrical connecting wire set. Two opposite ends of the retractable guiding rod are respectively connected to the casing and the tray. The electrical connecting wire set comprises a flexible wire and an adhesive structure. Two opposite ends of the flexible wire are respectively connected to the casing and the tray. The adhesive structure is connected to the flexible wire. The adhesive structure has a through hole. The retractable guiding rod is disposed through the through hole in order to guide the flexible wire to be folded or unfolded along the extending direction of the retractable guiding rod when the tray is moved with respect to the casing.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

Figure 1:
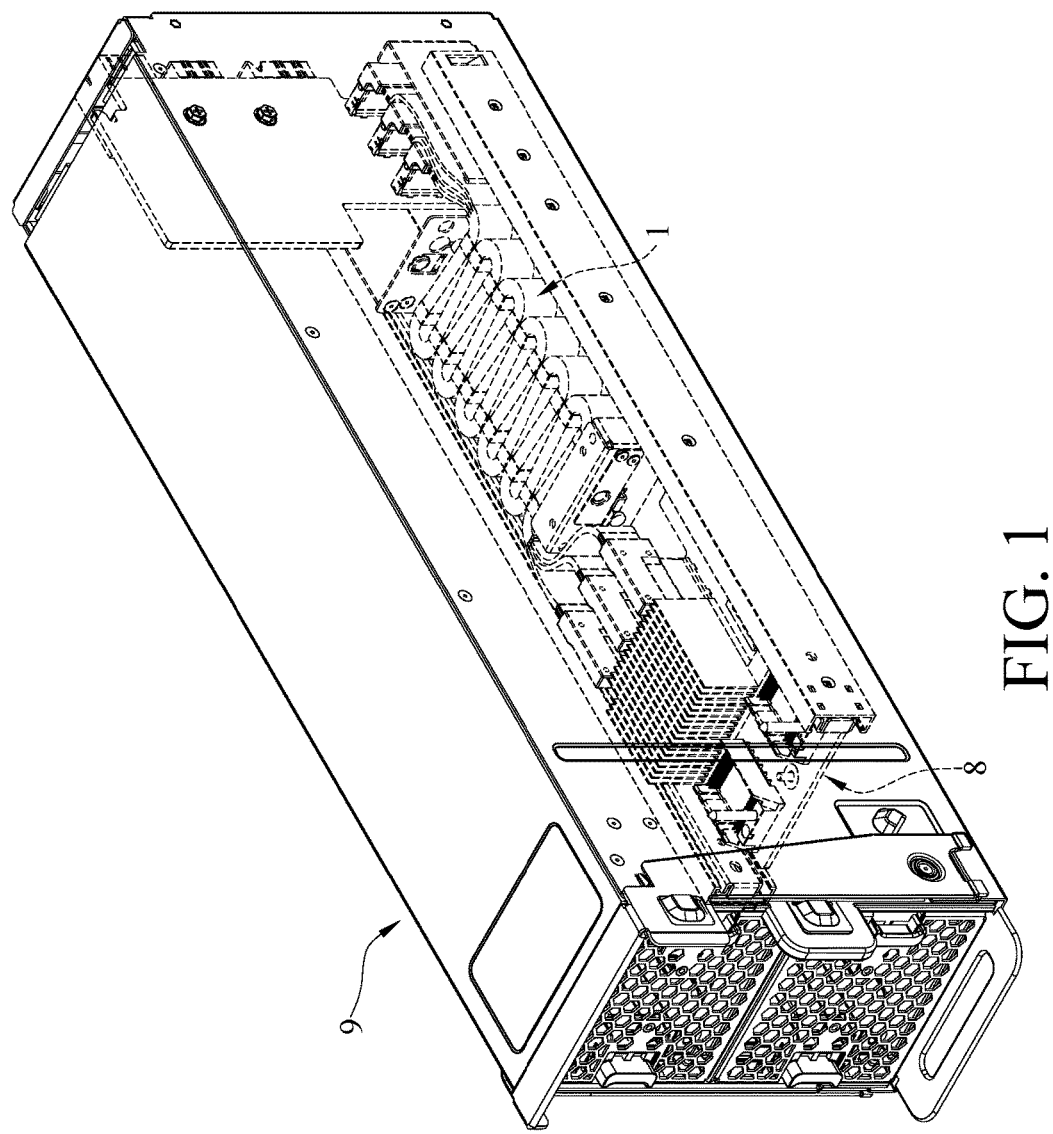
FIG. 1 is a perspective view of a retractable connecting device connected to a casing and a tray in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
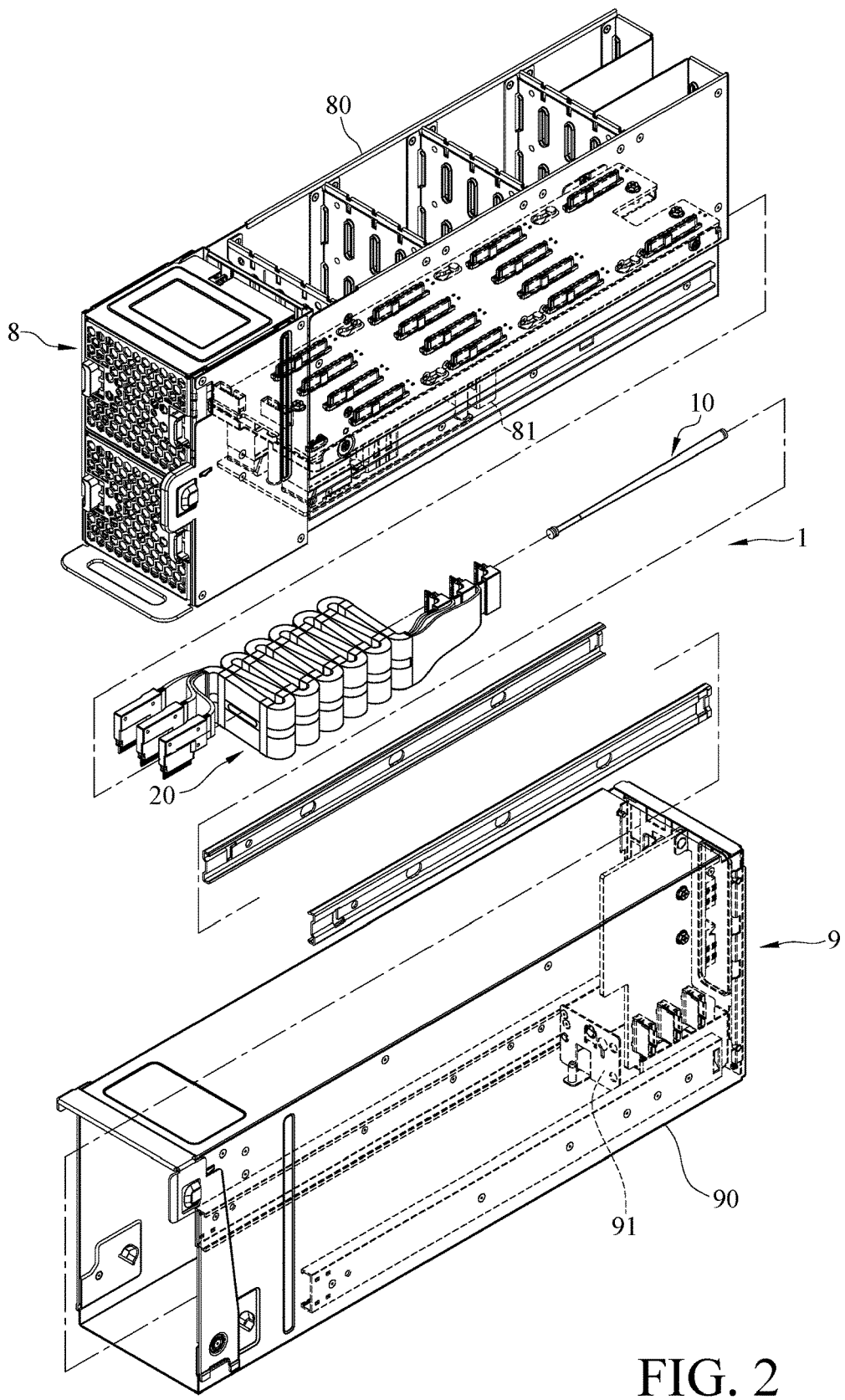
FIG. 2 is an exploded view of the retractable connecting device, the casing, and the tray in FIG. 1.
Figure 3:
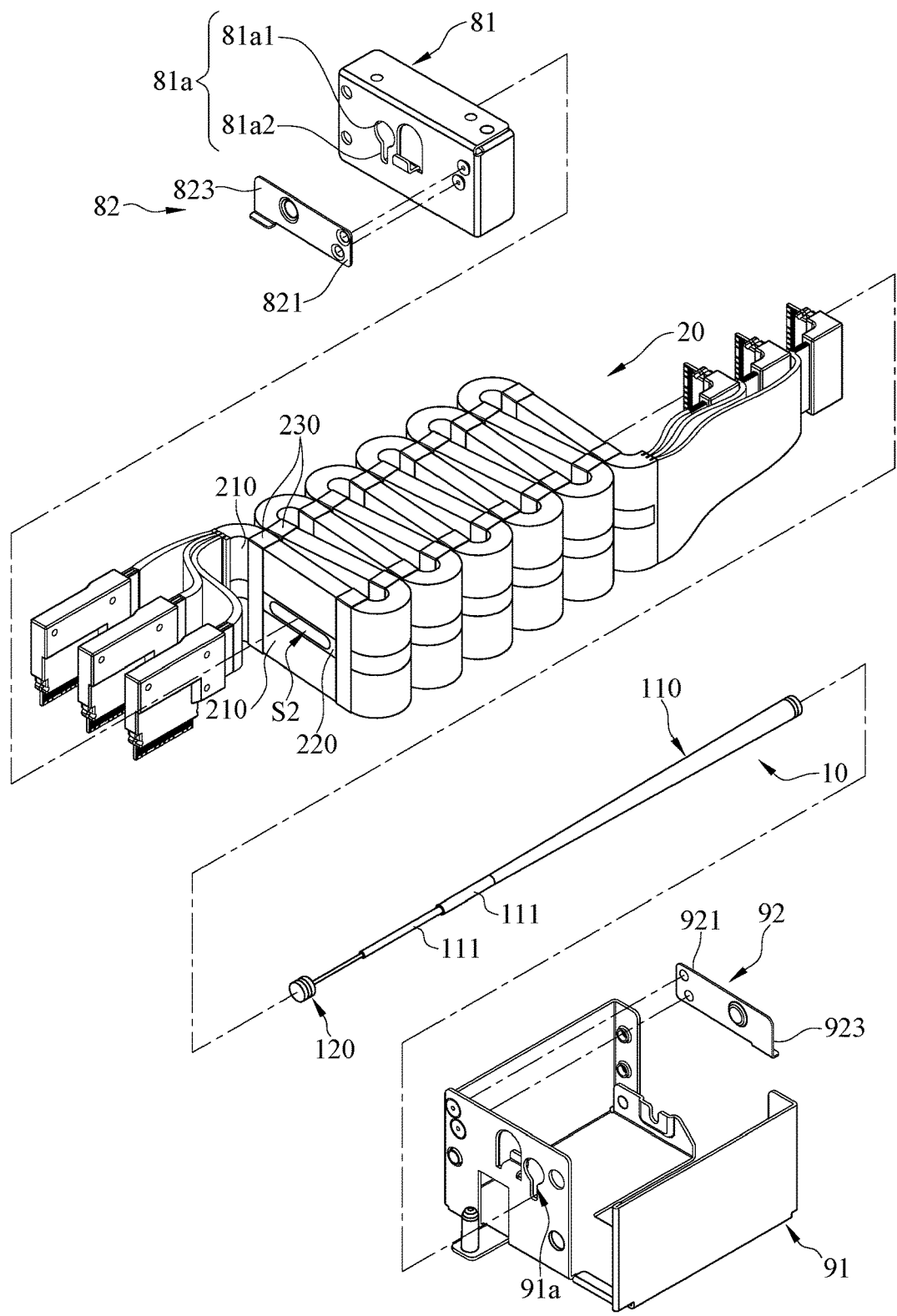
FIGS. 3-4 are partial enlarged exploded views of the retractable connecting device, the casing, and the tray in FIG. 1.
Figure 4:
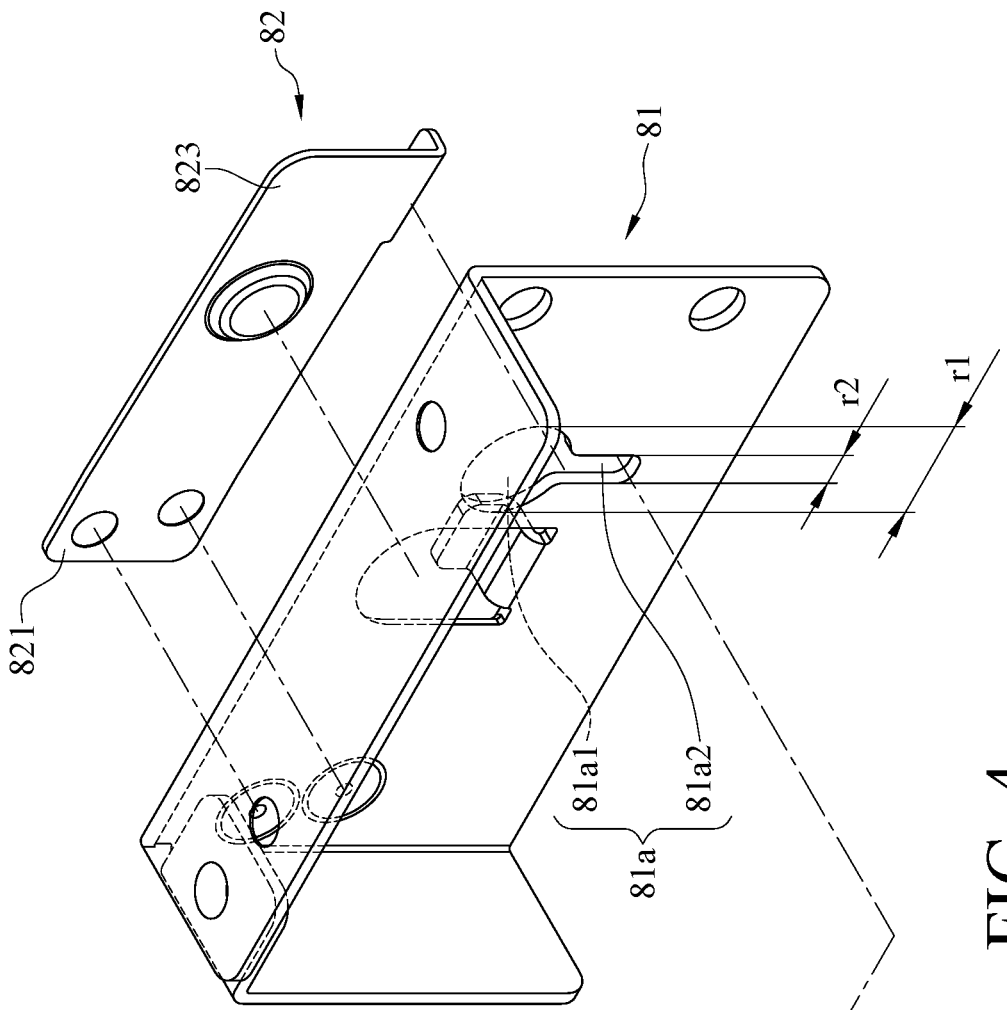

Please refer to FIG. 1, FIG. 2, FIG. 3 and FIG. 4. FIG. 1 is a perspective view of a retractable connecting device connected to a casing and a tray in accordance with a first embodiment of the disclosure. FIG. 2 is an exploded view of the retractable connecting device, the casing, and the tray in FIG. 1. FIGS. 3-4 are partial enlarged exploded views of the retractable connecting device, the casing, and the tray in FIG. 1.

As shown in FIG. 1 and FIG. 2, in this embodiment, a retractable connecting device 1 is provided. The retractable connecting device 1 is adapted to connect a casing 9 and a tray 8 slidably disposed on the casing 9.

In detail, the tray 8 includes a frame body 80 and an assembling rack 81. The frame body 80 is capable of carrying electronic components, such as hard disks and motherboards. The assembling rack 81 is assembled on the frame body 80 so that one end of the retractable connecting device 1 can be connected and fixed to it, and the aforementioned electronic components can be electrically connected to other electronic components not in the casing 9 or on another tray. In another embodiment of the present disclosure, one end of the retractable connecting device 1 is, for example, connected to a hard disk controlling board in the tray, and the other end is connected to the casing 9, but the present disclosure is not limited thereto.

In more detail, as shown in FIG. 3 and FIG. 4, the assembling rack 81 has an assembling hole 81a, and the assembling hole 81a has a large hole 81a1 and a small hole 81a2 connected to each other. A first hole diameter r1 of the large hole 81a1 is larger than a second hole diameter r2 of the small hole 81a2. From the view of the figure, the large hole 81a1 is above the small hole 81a2. In addition, the tray 8 further includes an elastic sheet 82, which is made of material with elasticity and resilience, such as metal or rubber. The elastic sheet 82 has a fixed end 821 and a movable end 823 opposite to each other. The fixed end 821 is fixed at one side of the assembling rack 81, for example, by screwing. The movable end 823 is movable with respect to the large hole 81a1, and normally moves toward the large hole 81a1 to cease on the side of the small hole 81a2 facing the large hole 81a1.

Then, the casing 9 includes a frame body 90, an assembling rack 91 and an elastic sheet 92. The frame body 90 is configured to carry the tray 8, and the frame body 80 of the tray 8 is movably disposed on the frame body 90 of the casing 9, for example, through a sliding track (not shown). The assembling rack 91 is assembled on the frame body 90 so that another end of the retractable connecting device 1 can be connected and fixed to it. As shown in FIG. 3, the assembling rack 91 has an assembling hole 91a. Because the configurations of the assembling hole 91a of the assembling rack 91 and the elastic sheet 92 are similar to the configurations of the assembling hole 81a and the elastic sheet 82, they would not be discussed.

As shown in FIG. 2 and FIG. 3, in this embodiment, the retractable connecting device 1 comprises a retractable guiding rod 10 and an electrical connecting wire set 20.

The retractable guiding rod 10 includes a retractable portion 110 and two assembling portions 120. The retractable portion 110 is located between and connected to the two assembling portions 120. The retractable portion 110 includes a plurality of movable parts 111 connected in line. The movable parts 111 are movable with respect to one another to change the length of the retractable portion 110. The retractable guiding rod 10 is able to be fixed to the assembling hole 81a of the tray 8 and the assembling hole 91a of the casing 9 through the two assembling portions 120. The process of assembling one of the assembling portions 120 and the assembling holes 81a is similar to the process of assembling another assembling portion 120 and the assembling holes 91a, therefore only the process of assembling one of the assembling portions 120 and the assembling hole 81a is described.

Figure 5:
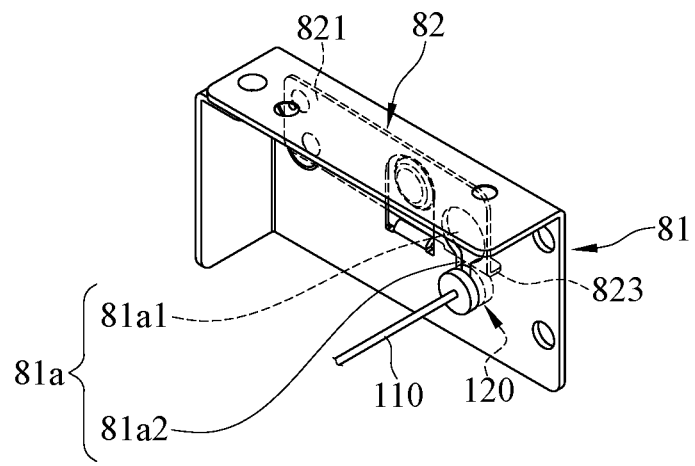
FIG. 5 is a partial enlarged view of a retractable guiding rod fixed to the tray in FIG. 1.
Figure 6:
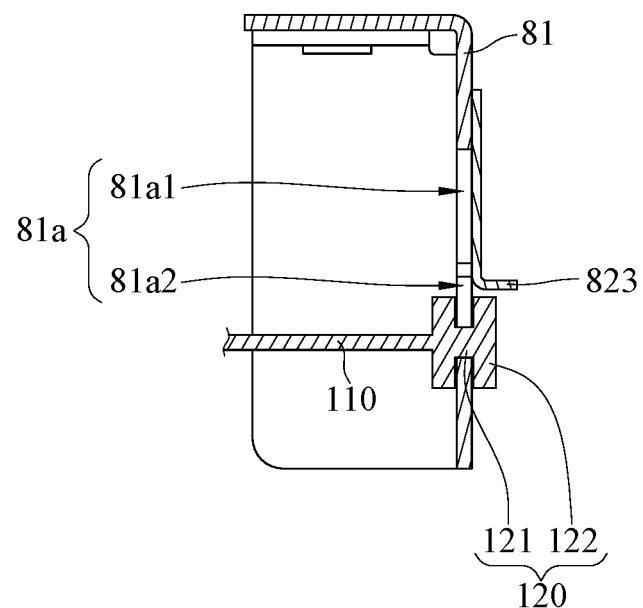
FIG. 6 is a partial enlarged side view of the retractable guiding rod fixed to the tray in FIG. 1.

Please refer to FIG. 4 and further refer to FIGS. 5-6. FIG. 5 is a partial enlarged view of a retractable guiding rod fixed to the tray in FIG. 1, and FIG. 6 is a partial enlarged side view of the retractable guiding rod fixed to the tray in FIG. 1. In detail, each assembling portion 120 includes a neck part 121 and a head part 122. The neck part 121 is located between and connected to the retractable portion 110 and head part 122. A first outer diameter R1 of the head part 122 is larger than a second outer diameter R2 of the neck part 121. The first hole diameter r1 of the large hole 81a1 is larger than the first outer diameter R1 of the head part 122. The second hole diameter r2 of the small hole 81a2 is slightly larger than the second outer diameter r2 of the neck part 121, but smaller than the first outer diameter R1 of the head part 122.

Before the assembling portion 120 being assembled to the assembling hole 81a, the movable end 823 of the elastic sheet 82 is moved to expose the large hole 81a1, and then, the head part 122 of the assembling portion 120 is moved through the assembling rack 81 via the large hole 81a1 of the assembling hole 81a so as to dispose the neck part 121 into the small hole 81a2. Since the outer diameter of the head part 122 and movable part 111 are all larger than the second hole diameter r2 of the small hole 81a2 so that the neck part 121 is fixed in the small hole 81a2 and restricted from moving in the extending direction of the retractable guiding rod 10. Meanwhile, the head part 122 and the elastic sheet 82 are on the same side of the assembling rack 81, and after the movable end 823 of the elastic sheet 82 returns to its original position, the movable end 823 would cease on a side of the small hole 81a2 facing the large hole 81a1. In other words, the movable end 823 is located on the top of the head part 122 in order to prevent the retractable guiding rod 10 from moving toward the large hole 81a1 to escape from the assembling hole 81a.

Figure 7:
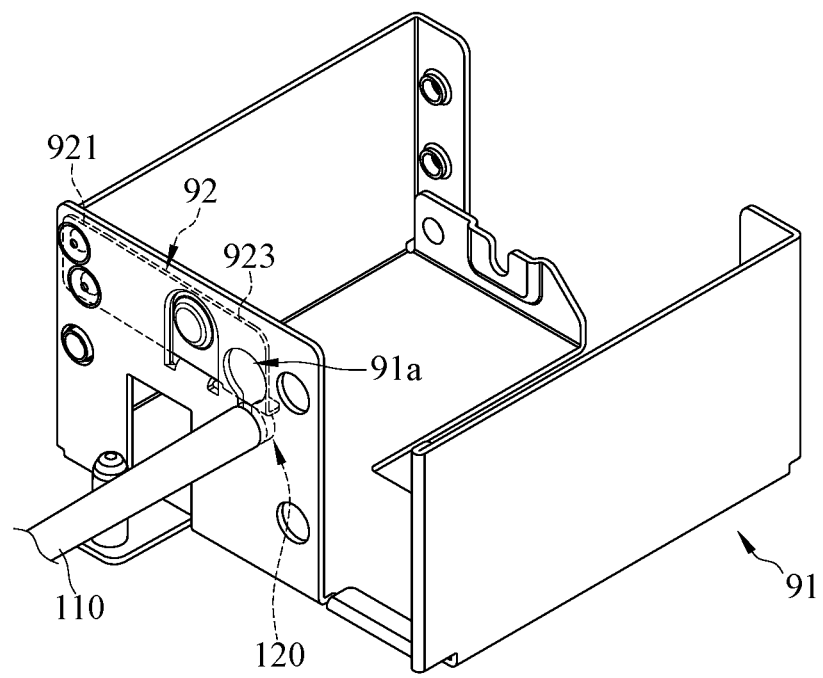
FIG. 7 is a partial enlarged view of the retractable guiding rod fixed to the casing in FIG. 1.

Similarly, as shown in FIG. 7, which is a partial enlarged view of the retractable guiding rod fixed to the casing in FIG. 1. The another assembling portion 120 of the retractable guiding rod 10 is able to be assembled on the assembling hole 91a of the casing 9 according to the manner stated above so that the retractable guiding rod 10 is able to be located between and connected to the casing 9 and the tray 8. It is reminding that the present disclosure is not limited to the number of the assembling portions 120, and the manner of assembling the assembling portions 120, the casing 9 and the tray 8. In other embodiment, only one end of the retractable guiding rod may have one assembling portion 120, and the assembling portion 120 may be assembled to the assembling hole 81a of the tray 8 according to the manner stated above; and another end of the retractable guiding rod without the assembling portion 120 may be fixed to the assembling rack 91 of the casing 9, for example, by welding.

The electrical connecting wire set 20 includes two flexible wires 210 and an adhesive structure 220. The flexible wires 210 are flexible. In this embodiment, each flexible wire 210 is, for example, a cable or a bus having multiple wires, and its two opposite ends are respectively electrically connected to the casing 9 (e.g. fixed on the side wall of the casing 9 so as to be electrically connected to other wires or back boards) and the power port of the hard disk back board on the tray 8 (not shown). The adhesive structure 220, so called "sealing membrane", is also made of flexible material. The adhesive structure 220 is located between and connected to the two flexible wires 210, but the present disclosure is not limited to the length and the position that the adhesive structure 220 is attached to the flexible wire 210. In addition, in order to enhance the structural strength of the electrical connecting wire set 20, the flexible wire 210 is tied with a plurality of plastic materials 230, but the plastic material 230 is optional, the present disclosure is not limited thereto.

In this embodiment, the adhesive structure 220 has a plurality of through holes S2, and each through hole S2 is, for example, an oval through hole. The retractable portion 110 of the retractable guiding rod 10 is disposed through the through holes S2 of the adhesive structure 220 so that the retractable guiding rod 10 is disposed through the electrical connecting wire set 20. In this embodiment or some other embodiments, the total length of the electrical connecting wire set 20 is longer than the total length of the retractable portion 110, and the two farthest through holes S2 are located between the two ends of the retractable portion 110 so that the electrical connecting wire set 20 is always slightly curved while it is disposed on the retractable guiding rod 10. It is reminding that the present disclosure is not limited to the number of the through holes of the adhesive structure; in other embodiments, the adhesive structure may have only one through hole.

In addition, in this embodiment, although the electrical connecting wire set includes two flexible wires, the present disclosure is not limited to the number of the flexible wires. In other embodiments, the electrical connecting wire set may only have one flexible wire, and the adhesive structure may be connected to one side of the flexible wire.

Figure 8:
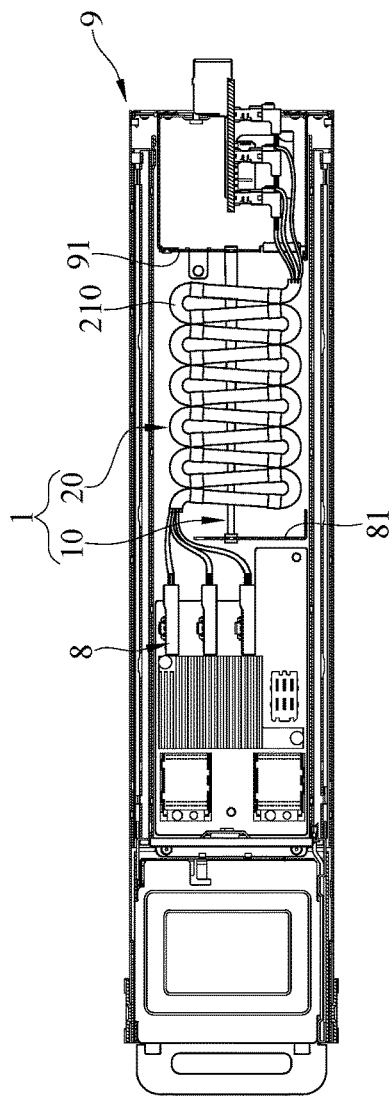
FIGS. 8-9 shows the operation of the retractable connecting device in FIG. 1.
Figure 9:
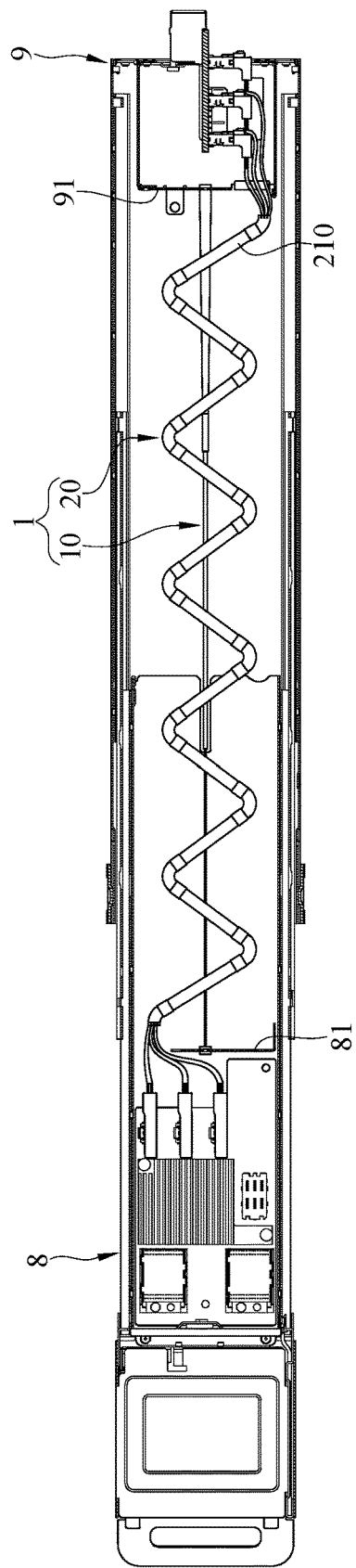

Then, please refer to FIG. 8 and FIG. 9; FIGS. 8-9 shows the operation of the retractable connecting device in FIG. 1. In operation, the assembling portions 120 on the two opposite ends of the retractable guiding rod 10 are respectively connected to the tray 8 and the casing 9, so when the tray 8 moves with respect to the casing 9, the movable parts 111 of the retractable portion 110 of the retractable guiding rod 10 are moved with respect to one another so as to change the length of the retractable portion 110, and the electrical connecting wire set 20 is deformed due to the movement of the tray 8. During the deformation, because the electrical connecting wire set 20 is disposed on the retractable portion 110 of the retractable guiding rod 10 through the through hole S2, the retractable guiding rod 10 is able to restrict the electrical connecting wire set 20 from moving in up, down, left and right directions. That is, the electrical connecting wire set 20 is only allowed to be folded or unfolded along the extending direction of the retractable guiding rod 10 by being guided by the retractable guiding rod 10.

Figure 10:
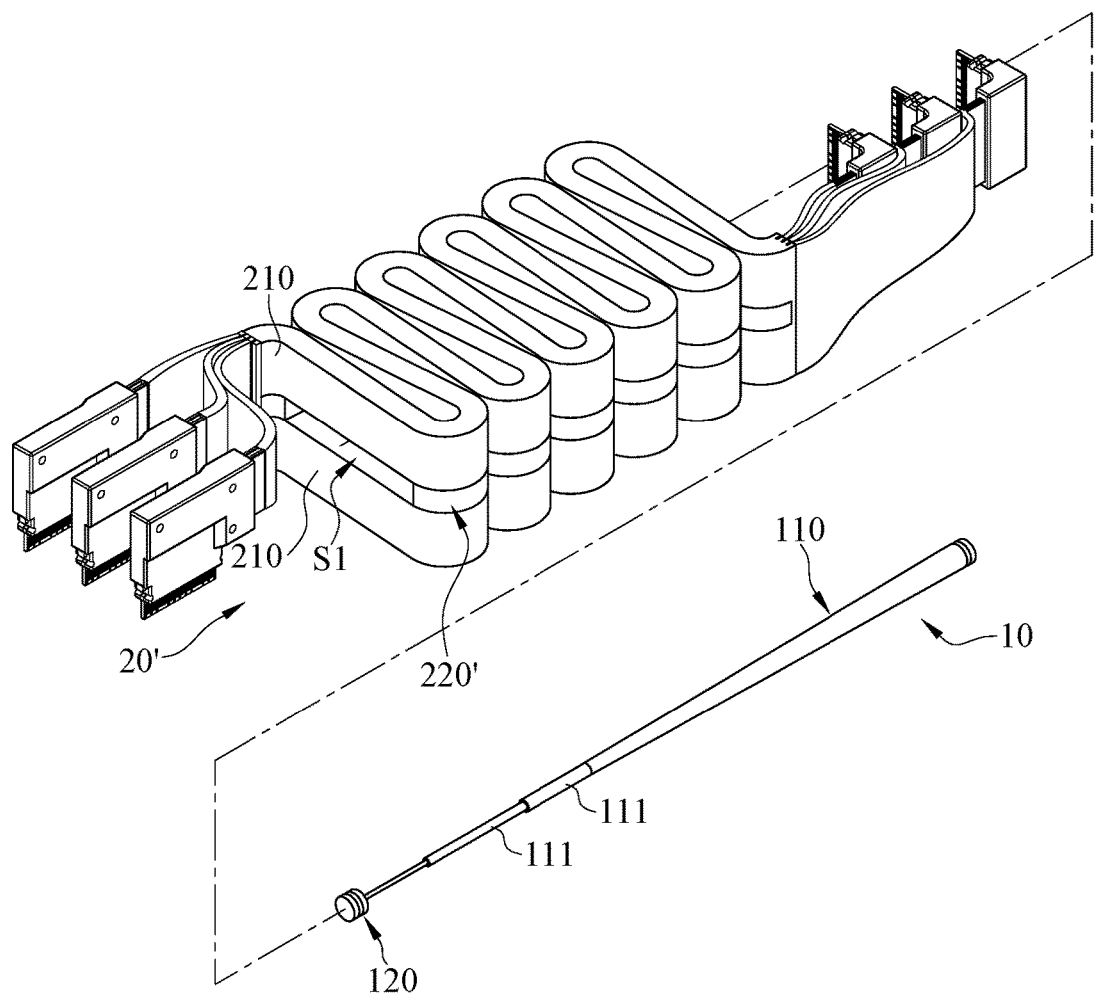
FIG. 10 is an exploded view of a retractable connecting device in accordance with another embodiment of the disclosure.

Furthermore, although the retractable guiding rod 10 in the aforementioned embodiment is disposed on the electrical connecting wire set 20 by being disposed through the multiple through holes S2 of the adhesive structure 220, the present disclosure is not limited thereto. Please refer to FIG. 10, which is an exploded view of a retractable connecting device in accordance with another embodiment of the disclosure. This embodiment provides an electrical connecting wire set 20', and the difference between this embodiment and the aforementioned embodiment is that the electrical connecting wire set 20' includes a plurality of adhesive structures 220' which are located between, connected to the two flexible wires 210 and spaced apart from each other. For example, the adhesive structures 220' are located on the bend portion of the flexible wire 210. Particularly, the adhesive structures 220' do not have the through hole S2 described in above, and the retractable portion 110 of the retractable guiding rod 10 is disposed through the through hole S1 surrounded by the adhesive structures 220' and the two flexible wires 210. In operation, the retractable guiding rod 10 is still able to guide and restrict the electrical connecting wire set 20'. Moreover, in this embodiment, there is no need to form the through hole S2, so the manufacturing cost is reduced.

According to the retractable connecting device in the above, when the retractable guiding rod is disposed through the electrical connecting wire set, it restricts the electrical connecting wire set from moving in up, down, left and right directions; therefore, the electrical connecting wire set can only be folded or unfolded along the extending direction of the retractable guiding rod by being guided by the retractable guiding rod. As a result, the retractable guiding rod prevents the electrical connecting wire set from tangling.

Moreover, the retractable guiding rod is disposed between the casing and the back side of the tray, and thus it occupies much less space of the casing. Therefore, the retractable guiding rod is adaptive to narrow type casings, and is favorable for the casing to have a longer flexible wire for the tray to being drawn out more.

In addition, the design of the through holes of the adhesive structure or the through holes between the wires and the adhesive structure incorporated with the retractable guiding rod is beneficial for reducing the manufacturing cost.

What is claimed is:

1. A retractable connecting device, adapted to connect a casing and a tray, the tray being slidably disposed on the casing, and the retractable connecting device comprising:
   a retractable guiding rod, two opposite ends of the retractable guiding rod respectively connected to the casing and the tray;
   an electrical connecting wire set, comprising a flexible wire and an adhesive structure, two opposite ends of the flexible wire respectively connected to the casing and the tray, the adhesive structure connected to the flexible wire, wherein the adhesive structure has a through hole, and the retractable guiding rod is disposed through the through hole in order to guide the flexible wire to be folded or unfolded along an extending direction of the retractable guiding rod when the tray is moved with respect to the casing.

2. The retractable connecting device according to claim 1, wherein the flexible guiding rod comprises a retractable portion and at least one assembling portion, the retractable portion is disposed through the through hole, one end of the retractable portion away from the at least one assembling portion is connected to the casing, and the at least one assembling portion is connectable to the tray.

3. The retractable connecting device according to claim 2, wherein the at least one assembling portion has a neck part and a head part, the neck part is located between and connected to the retractable portion and the head part, a first outer diameter of the head part is larger than a second outer diameter of the neck part, the tray has an assembling hole, the assembling hole comprises a large hole and a small hole connected to each other, wherein a first hole diameter of the large hole is larger than a second hole diameter of the small hole, the second hole diameter of the small hole is slightly larger than the second outer diameter of the neck and smaller than the first outer diameter of the head part so as to assemble the at least one assembling portion to the small hole to make the retractable guiding rod to be connected to the tray.

4. The retractable connecting device according to claim 3, wherein the tray comprises an assembling rack and an elastic sheet, the assembling hole is on the assembling rack, the elastic sheet has a fixed end and a movable end, the fixed end is fixed on the assembling rack, the movable end is movable with respect to the large hole and configured to cover or expose the large hole; when the neck part of the at least one assembling portion of the retractable guiding rod is assembled at the small hole, the movable end of the elastic sheet ceases on a side of the small hole facing the large hole.

5. The retractable connecting device according to claim 2, wherein the retractable portion comprises a plurality of movable parts connected in line, and the movable parts are movable with respect to one another in order to change a length of the retractable portion.

6. A retractable connecting device, adapted to connect a casing and a tray, the tray being slidably disposed on the casing, and the retractable connecting device comprising:
   a retractable guiding rod, two opposite ends of the retractable guiding rod respectively connected to the casing and the tray;
   an electrical connecting wire set, comprising two flexible wires and a plurality of adhesive structures, two opposite ends of the two flexible wires respectively connected to the casing and the tray, the adhesive structures located between and connected to the two flexible wires, wherein there are a plurality of through holes surrounded by the two flexible wires and the adhesive structures, the retractable guiding rod is disposed through the plurality of through holes in order to guide the flexible wires to be folded or unfolded along an extending direction of the retractable guiding rod when the tray is moved with respect to the casing.

7. The retractable connecting device according to claim 6, wherein the flexible guiding rod comprises a retractable portion and at least one assembling portion, the retractable portion is disposed through the plurality of through holes, one end of the retractable portion away from the at least one assembling portion is connected to the casing, and the at least one assembling portion is connectable to the tray.

8. The retractable connecting device according to claim 7, wherein the retractable portion comprises a plurality of movable parts connected in line, and the movable parts are movable with respect to one another in order to change a length of the retractable portion.

* * * * *